(12) United States Patent
Sung (10) Patent No.: US 7,605,656 B2
(45) Date of Patent: Oct. 20, 2009

(54) OPERATIONAL AMPLIFIER WITH RAIL-TO-RAIL COMMON-MODE INPUT AND OUTPUT RANGE

(75) Inventor: Kuang-Feng Sung, Taichung County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 196 days.

(21) Appl. No.: 11/781,268

(22) Filed: Jul. 22, 2007

(65) Prior Publication Data

US 2008/0278232 A1 Nov. 13, 2008

(30) Foreign Application Priority Data

May 9, 2007 (TW) .............................. 96116485 A (51) Int. Cl.
*H03F 3/04* (2006.01)
(52) U.S. Cl. ...................................... 330/258; 330/255
(58) Field of Classification Search ................. 330/255, 330/258

See application file for complete search history.

(56) References Cited

U.S. PATENT DOCUMENTS 5,311,145 A 5/1994 Huijsing et al.
5,361,041 A * 11/1994 Lish ........................... 330/255

* cited by examiner

*Primary Examiner*—Michael B Shingleton
(74) *Attorney, Agent, or Firm*—Winston Hsu (57) ABSTRACT

An operational amplifier with a rail-to-rail common-mode input and output range comprises a differential input stage consisting of a first differential pair and a second differential pair for receiving an input signal; a summing circuit coupled to the differential input stage for outputting a summation result of the output signals of the first differential pair and second differential pair; and a push-pull output stage coupled to the summing circuit for outputting an amplified signal comprising an output terminal for outputting the amplified signal, a source coupled transistors for generating a control voltage according to output current of the summing circuit, and a first output transistor and a second output transistor for controlling current of the first output transistor and the second output transistor according to the control voltage of the source coupled transistor.

19 Claims, 5 Drawing Sheets

OPERATIONAL AMPLIFIER WITH RAIL-TO-RAIL COMMON-MODE INPUT AND OUTPUT RANGE

BACKGROUND OF THE INVENTION

1. Field of the Invention

The present invention relates to an operational amplifier with a rail-to-rail common-mode input and output range, and more particularly, to an operational amplifier with a rail-to-rail common-mode input and output range having a push-pull output stage, least current paths, a simplest circuit structure and a lowest operating voltage.

2. Description of the Prior Art

With the advance of semiconductor technologies, operating voltages of integrated circuits become lower and lower, such as for the 0.25 μm CMOS process, the typical operating voltage is as low as 2.5V. However, the threshold voltages needed to turn on the CMOS transistors (PMOS/NMOS) is about 0.6V, and thus, for the design of analog circuits, problems of insufficient input and output common-mode voltage of an operational amplifier often occur. In order to solve these problems, the operational amplifier needs to have a rail-to-rail common-mode input and output range.

Figure 1:
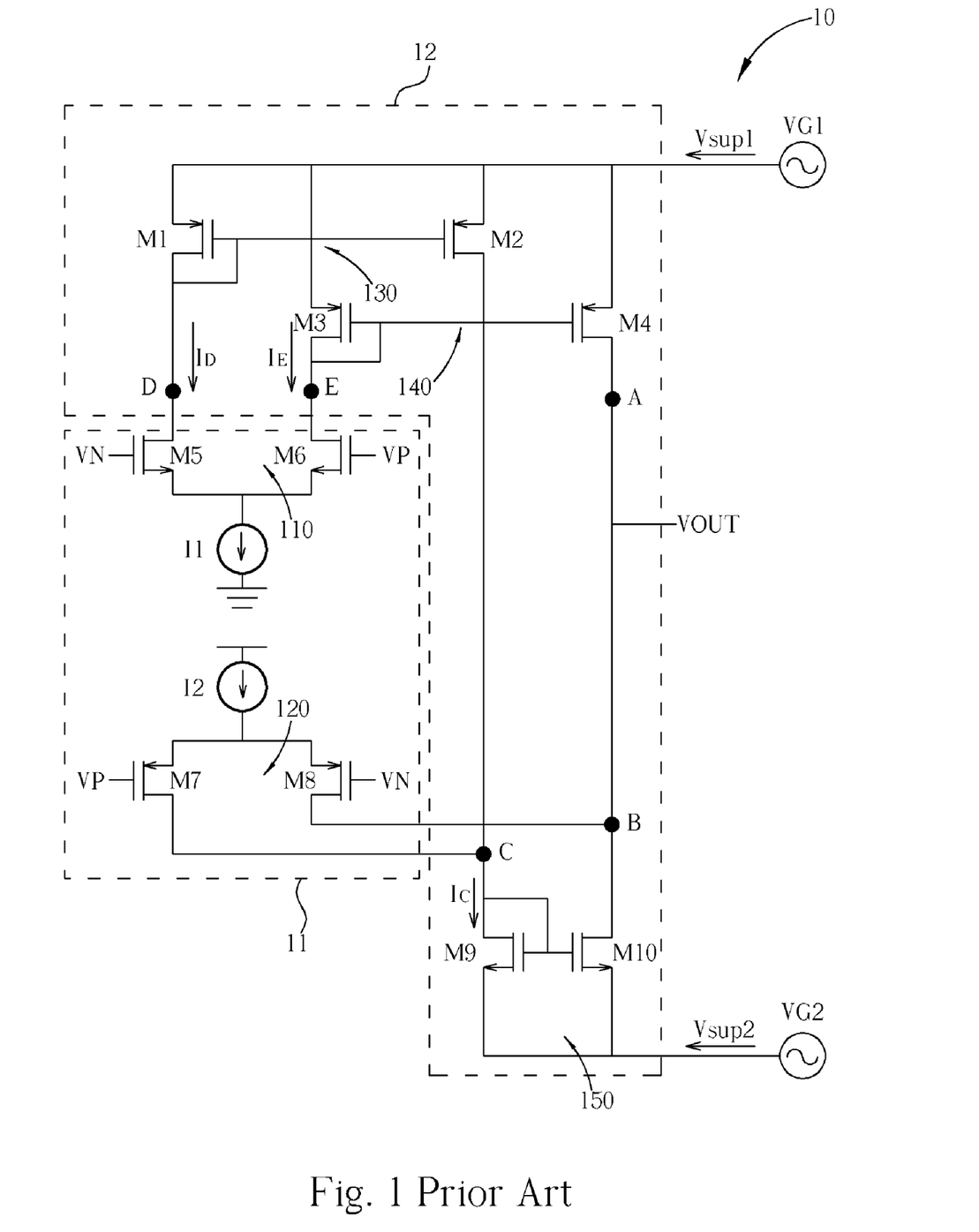
FIG. 1 is a schematic diagram of a prior art rail-to-rail operational amplifier.

Please refer to FIG. 1. FIG. 1 is a schematic diagram of a prior art rail-to-rail operational amplifier 10. The operational amplifier 10 is a two-stage amplifier, and includes a differential input stage 11 and an output stage 12. The differential input stage 11 includes a first differential input pair 110 and a second differential input pair 120. The first differential input pair 110 comprises a pair of matched NMOS transistors M5 and M6 and a first current source 11. The first current source 11 is coupled to the source electrodes of the transistors M5 and M6, and is utilized for providing quiescent currents of the first differential input pair 110. The gate electrodes of the transistors M5 and M6 are respectively coupled to a negative input terminal VN and a positive input terminal VP, and are utilized for receiving signals being amplified. Additionally, the drain electrodes of the transistors M5 and M6 are coupled to nodes D and E, respectively. Similarly, the second differential input pair 120 comprises a pair of matched PMOS transistors M7 and M8 and a second current source 12. The second current source 12 is coupled to the source electrodes of the transistors M7 and M8, and is utilized for providing quiescent currents of the second differential input pair 120. The gate electrodes of the transistors M7 and M8 are respectively coupled to the positive input terminal VP and the negative input terminal VN. The drain electrodes are coupled to nodes C and B.

The output stage 12 is a summing circuit, driven by a first supply voltage $V_{SUP1}$ and a second supply voltage $V_{SUP2}$, for outputting a summation result of output signals of the first differential input pair 110 and the second differential input pair 120 through an output terminal VOUT, and includes a first current mirror 130, a second current mirror 140 and a third current mirror 150. The first current mirror 130 comprises PMOS transistors M1 and M2, and is utilized for mapping a current ID passing through the node D to the node C. Note that, the operations of the first current mirror 130 is well known by those skilled in the art, so as not to be narrated herein. In the same manner, the second current mirror 140 comprises PMOS transistors M3 and M4, and is utilized for mapping a current IE passing through the node E to a node A; and the third current mirror 150 comprises NMOS transistors M9 and M10, and is utilized for mapping a current $I_C$ flowing out of the node C to the node B. The output terminal VOUT is coupled to the nodes A and B, and is utilized for outputting the summation result of the output signals of the first differential input pair 110 and the second differential input pair 120.

Therefore, for the first differential input pair 110, when the common mode voltage of the input signal (VP+VN)/2 is in a low voltage range, such as lower than the second supply voltage $V_{SUP2}$ plus a threshold voltage of the transistors M5 and M6, the transistors M5 and M6 cannot be turned on, so that the first differential input pair 110 cannot work normally. Thus, the effective working range of the first differential input pair 110 is restricted between the first supply voltage $V_{SUP1}$ and the second supply voltage $V_{SUP2}$ plus the threshold voltage of the transistors ($V_{SUP2}$+VTH), that means, the common-mode voltage input range of the first differential pair 110 can be as high as the first supply voltage $V_{SUP1}$. Conversely, for the second differential input pair 120, when the common mode voltage of the input signal (VP+VN)/2 is in a high voltage range, such as higher than the first supply voltage $V_{SUP1}$ minus a threshold voltage of the transistors M7 and M8, the transistors M7 and M8 cannot be turned on, so that the second differential pair 120 cannot work normally. Thus, the effective working range of the second differential input pair 120 is restricted between the first supply voltage $V_{SUP1}$ minus the threshold voltage of the transistors ($V_{SUP1}$−VTH) and the second supply voltage $V_{SUP2}$, that means, the common-mode voltage input range of the second differential pair 120 can be as low as the second supply voltage $V_{SUP2}$.

Therefore, as shown in FIG. 1, the operational amplifier 10 has advantages such as less current paths and less transistors, and so on. However, since the operational amplifier 10 does not have a push-pull output stage, the applications of the operational amplifier 10 are greatly limited.

Figure 2:
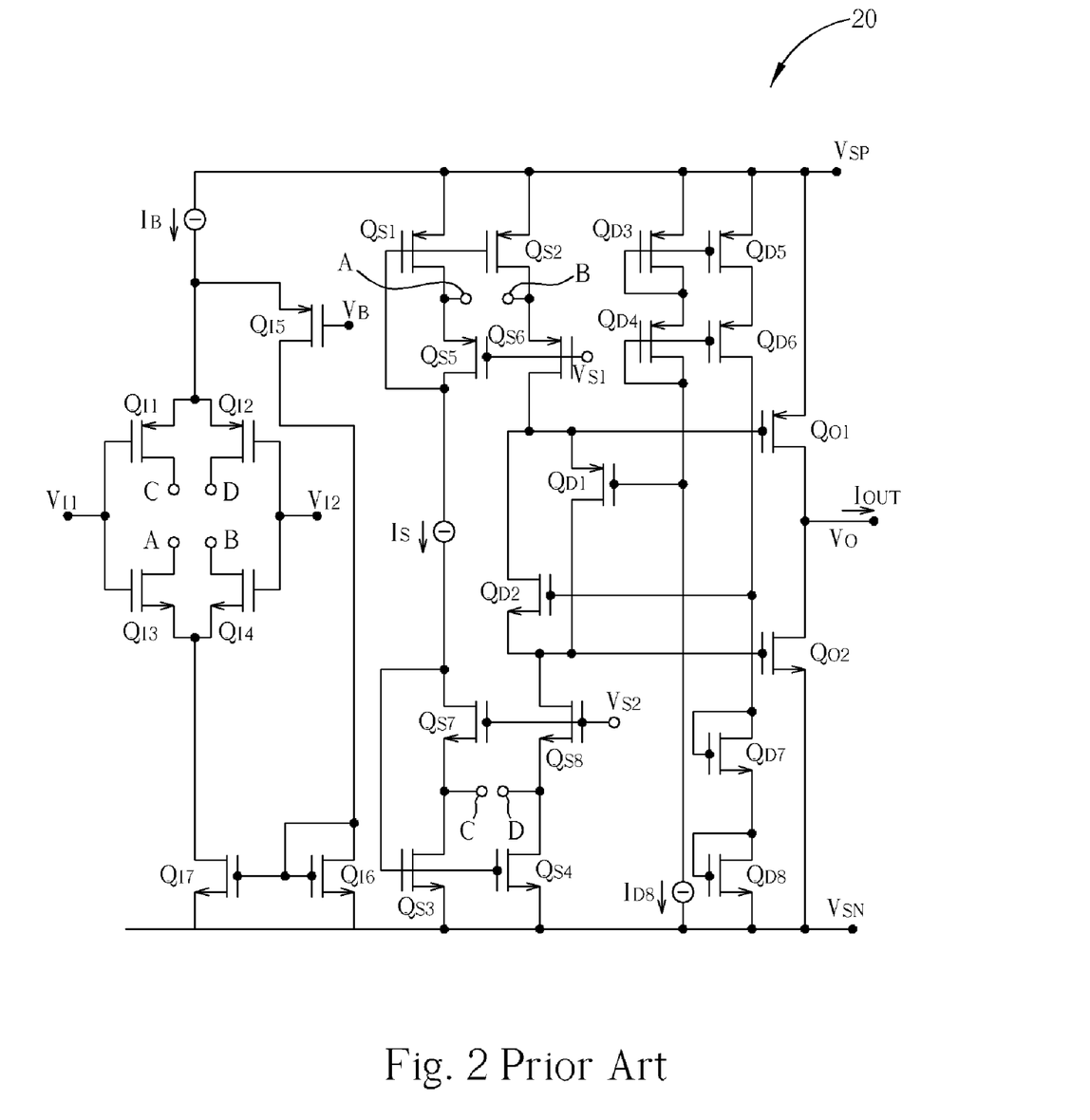
FIG. 2 is a schematic diagram of another prior art rail-to-rail operational amplifier.

Please refer to FIG. 2. FIG. 2 is a schematic diagram of another prior art rail-to-rail operational amplifier 20. The operational amplifier 20 is disclosed in U.S. Pat. No. 5,311,145 "Combination Driver-Summing Circuit for Rail-to-Rail Differential Amplifier". In the operational amplifier 20, a floating current source IS, coupled between the drain electrodes of transistors QS5 and QS7, is utilized for generating a stable quiescent current to provide the push-pull output stage a stable quiescent bias voltage. In this case, the operational amplifier 20 not only has a rail-to-rail common-mode input and output range, but also has a folded cascade structure capable of generating high gain, a class AB output stage and least quiescent paths. However, the use of the floating current source IS increases the number of the transistors significantly, and thus wiring of the operational amplifier 20 becomes more complicated, so as to further increase the layout area and the difficulty for integrating circuits.

SUMMARY OF THE INVENTION

It is therefore a primary objective of the present invention to provide an operational amplifier with a rail-to-rail common-mode input and output range.

The present invention discloses an operational amplifier with a rail-to-rail common-mode input and output range. The operational amplifier includes a first voltage generator for generating a first supply voltage, a second voltage generator for generating a second supply voltage, a differential input stage for receiving an input signal, a summing circuit coupled to the differential input stage, and a push-pull output stage, coupled to the summing circuit, for outputting an amplification signal. The differential input stage includes a first differential pair including a first positive input terminal, a first negative input terminal, a first positive output terminal and a first negative output terminal; and a second differential pair including a second positive input terminal, a second negative input terminal, a second positive output terminal and a second negative output terminal. The summing circuit includes a first current output terminal and a second current output terminal, and is utilized for outputting a summation result of output signals of the first positive output terminal, the first negative output terminal, the second positive output terminal and the second negative output terminal. The push-pull output stage includes an output terminal for outputting the amplification signal; a source coupled circuit, including a first terminal coupled to the first current output terminal of the summing circuit and a second terminal coupled to the second current output terminal of the summing circuit, for generating a control voltage according to currents of the first current output terminal and the second current output terminal; a first output transistor including a source electrode coupled to the first voltage generator, a drain electrode coupled to the output terminal, and a gate electrode, coupled to the first terminal of the source coupled circuit, for controlling the first output transistor according to the control voltage of the source coupled circuit; and a second output transistor comprising a source electrode coupled to the second voltage generator, a drain electrode coupled to the output terminal, and a gate electrode, coupled to the second terminal of the source coupled circuit, for controlling the second output transistor according to the control voltage of the source coupled circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
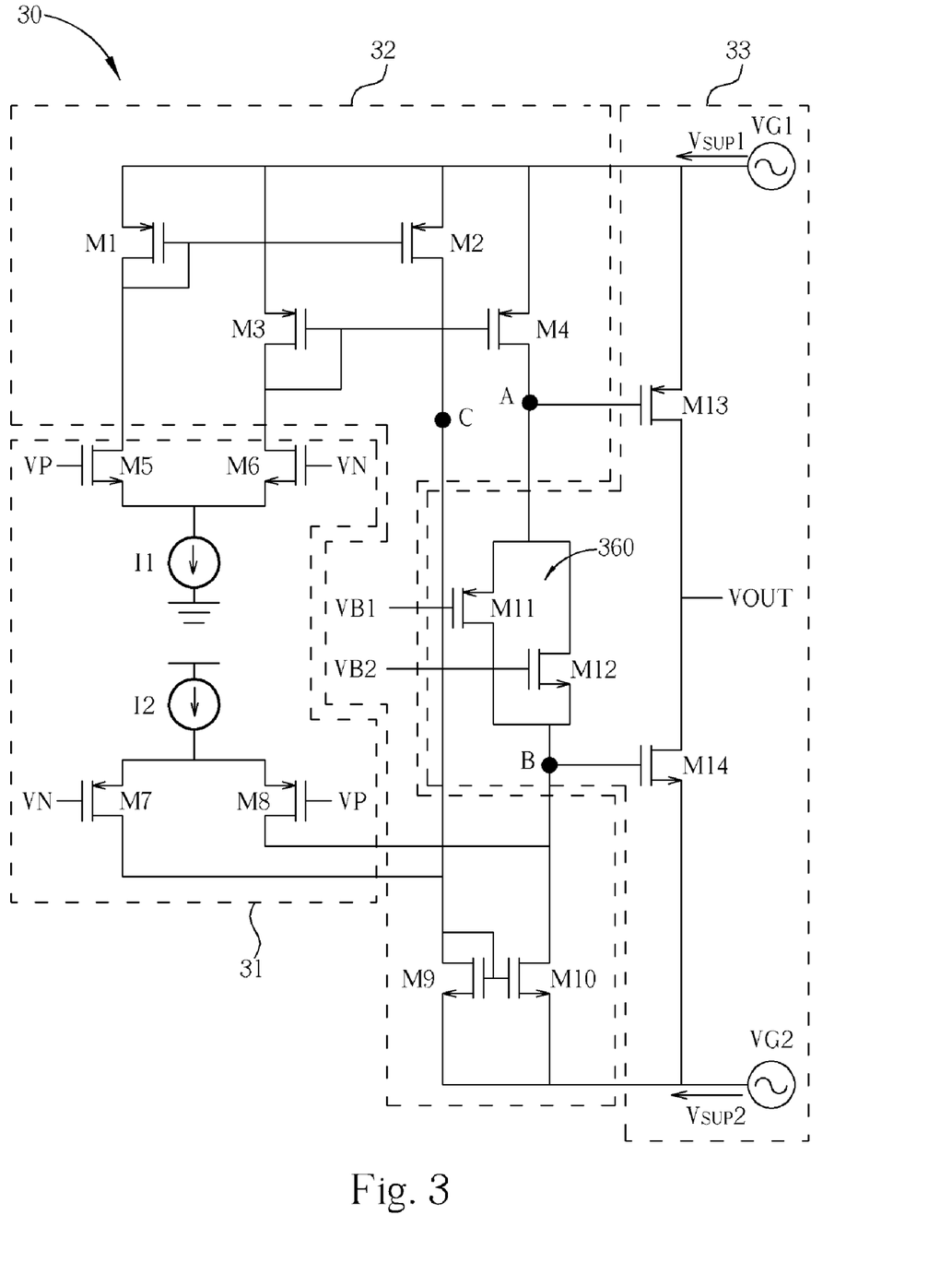
FIG. 3 is a schematic diagram of an operational amplifier with a rail-to-rail common-mode input and output range according to a first embodiment of the present invention.

Please refer to FIG. 3. FIG. 3 is a schematic diagram of an operational amplifier 30 with a rail-to-rail common-mode input and output range according to a first embodiment of the present invention. The operational amplifier 30 includes a differential input stage 31, a summing circuit 32 and a push-pull output stage 33. The differential input stage 31 and the summing circuit 32, composed by transistors M1-M10, are similar to the differential input stage 11 and the output stage 12 in FIG. 1, and the related operations can be referred to the foregoing description, so as not to be narrated herein.

The push-pull output stage 33 is coupled to the summing circuit 32, and is utilized for outputting an amplification signal. The push-pull output stage 33 includes a source coupled circuit 360, a first output transistor M13, a second output transistor M14 and an output terminal VOUT. The source coupled circuit 360, coupled between a first current output terminal of the summing circuit 32 (i.e. node A) and a second current output terminal of the summing circuit 32 (i.e. node B), is utilized for generating a control voltage VAB according to output currents of the summing circuit 32. The source coupled circuit 360 is composed by a PMOS transistor M11 and an NMOS transistor M12. The transistors M11 and M12 are coupled head-to-tail, that is, the source electrode of the transistor M11 and the drain electrode of the transistor M12 are coupled to the node A, and the drain electrode of the transistor M11 and the source electrode of the transistor M12 are coupled to the node B. The gate electrodes of the transistors M11 and M12 are coupled to bias voltages VB1 and VB2, respectively. The first output transistor M13 is a PMOS transistor, of which the source electrode is coupled to a first voltage generator VG1, the drain electrode is coupled to the output terminal VOUT and the gate electrode is coupled to the node A for controlling operation of the first output transistor M13 according to the control voltage VAB of the source coupled circuit 360. The second output transistor M14 is an NMOS transistor, of which the drain electrode is coupled to the output terminal VOUT, the source electrode is coupled to a second voltage generator VG2 and the gate electrode is coupled to the node B for controlling operations of the second output transistor M1 according to the control voltage VAB of the source coupled circuit 360.

The source coupled circuit 360 can be considered as a resistance element, and is utilized for providing the bias voltage of the first output transistor M13 and the second output transistor M14 to drive the push-pull output stage 33, and thus better working efficiency of the operational amplifier can be obtained. When the current summed up by the summing circuit 32 passes through the source coupled circuit 360, a voltage difference, i.e. the control voltage VAB, can be generated by the two terminals of the source coupled circuit 360 (node A and node B). The control voltage VAB can vary with the value of the inputted signal to control the operations of the first output transistor M13 and the second output transistor M14, so as to drive the push-pull output stage 33.

When the voltage of the positive input terminal VP of the differential input stage 31 is greater than that of the negative input terminal VN, the current outputted by the two terminals of the summing circuit 32 decreases, with a result that the voltage of the two terminals of the source coupled circuit 360 (i.e. node A and node B) also decreases. Therefore, the current passing through the first output transistor M13 increases, and the current passing through the second output transistor M14 decreases. Conversely, when the voltage of the negative input terminal VN is greater than that of the positive input terminal VP, the current passing through the first output transistor M13 decreases, and the current passing through the second output transistor M14 increases. In addition, when the voltage of the positive input terminal VP is equal to that of the negative input terminal VN (i.e. in common-mode state), the currents passing through the first output transistor M13 and the second output transistor M14 are the same, and the value of the currents depends on the control voltage VAB. Therefore, the operational amplifier 30 of the present invention can control the currents of the push-pull output stage 33 with the source coupled circuit 360 integrated in the summing circuit 32, with a result that the present invention has a class AB output stage and least quiescent current paths as well.

Therefore, compared with the operational amplifier 10 in FIG. 1, the operational amplifier 30 of the present invention not only has a rail-to-rail common-mode input and output range but also the push-pull output stage 33, and thus the best working efficiency and the least distortion can be achieved. On the other hand, compared with the operational amplifier 20 in FIG. 2, the operational amplifier 30 of the present invention can control the operations of the push-pull output stage 33 with the summing circuit 32, such that the floating current source can be saved for controlling the quiescent currents. In this case, the number of the transistors can be reduced significantly, and a simplest circuit structure can also be obtained for saving production cost. Moreover, since the operational amplifier 30 does not have a cascade transistor structure, the operating voltage can be as low as 3V.

Figure 4:
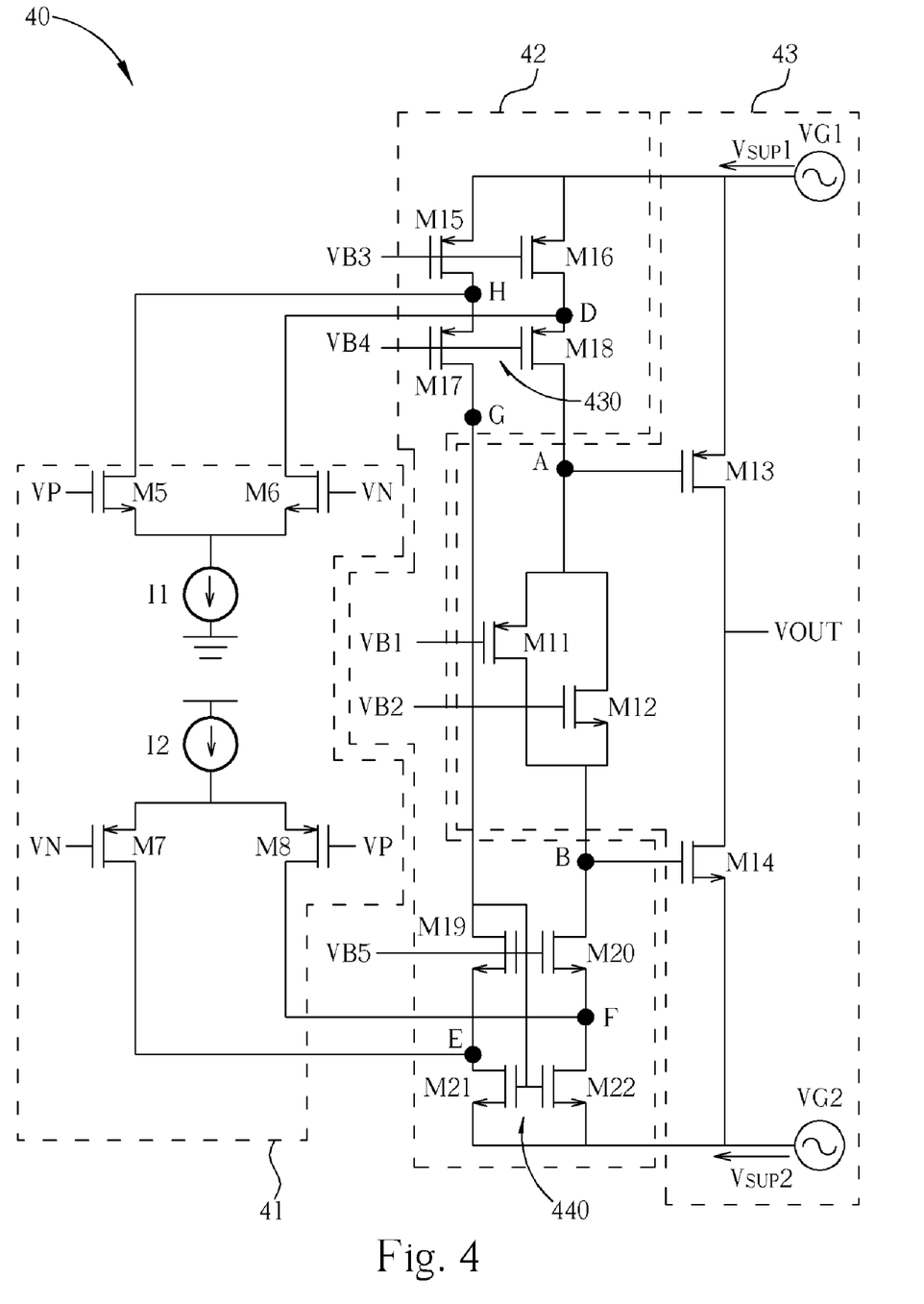
FIG. 4 is a schematic diagram of an operational amplifier with a rail-to-rail common-mode input and output range according to a second embodiment of the present invention.

Please refer to FIG. 4. FIG. 4 is a schematic diagram of an operational amplifier 40 with a rail-to-rail common-mode input and output range according to a second embodiment of the present invention. The operational amplifier 40 includes a differential input stage 41, a summing circuit 42 and a push-pull output stage 43, among which the differential input stage 41 and the push-pull output stage 43 are similar to the differential input stage 31 and the push-pull output stage 33 in FIG. 3, and thus are not narrated again. The summing circuit 42 includes a cascade current source circuit 430 and a current mirror circuit 440. The cascade current source circuit 430, comprised by PMOS transistors M15-M18, is utilized for providing a stable quiescent current. The current mirror circuit 440, comprised by NMOS transistors M19-M22, is utilized for summing up current signals outputted by a first differential pair 410 and a second differential pair 420 of the differential input stage 41, and for outputting a summation result to the source coupled circuit 460.

Note that, the drain electrode of the transistor M15, the source electrode of the transistor M17 and the drain electrode of the transistor M5 are coupled to a node H; the drain electrode of the transistor M16, the source electrode of the transistor M18 and the drain electrode of the transistor M6 are coupled to a node D; the source electrode of the transistor M17, the drain electrode of the transistor M19 and the gate electrodes of the transistor M21 and M22 are coupled to a node G; the source electrode of the transistor M19, the drain electrode of the transistor M21 and the drain electrode of the transistor M7 are coupled to a node E; and the source electrode of the transistor M20, the drain electrode of the transistor M22 and the drain electrode of the transistor M8 are coupled to a node F. Furthermore, the gate electrodes of the transistors M15 and M16 are coupled to a bias voltage VB3; the gate electrodes of the transistors M17 and M18 are coupled to a bias voltage VB4; and the gate electrodes of the transistors M19 and M20 are coupled to a bias voltage VB5.

Therefore, with the cascade current source circuit 430, the operational amplifier 40 of the present invention can provide the stable quiescent current to the source coupled circuit 460; and with the current mirror circuit 440, the operational amplifier 40 can sum up the currents outputted by the first differential pair 410 and the second differential pair 420, and can output to the source coupled circuit 460 for generating the control voltage VAB, so as to control the operation of the push-pull output stage 43. Moreover, since the operational amplifier 40 has a folded cascade structure, high gain can then be obtained.

Compared with FIG. 3, the operational amplifier 40 not only has a rail-to-rail common-mode input and output range, but also has a folded cascade structure capable of generating high gain and a class AB output stage with better working efficiency and less distortion. However, most important of all is that the operational amplifier 40 keeps the same current paths. In addition, compared with FIG. 2, the operational amplifier 40 saves the use of the floating current source, and thus the number of the transistors can be reduced significantly, so as to further reduce the layout area and simplify the difficulty for integrating circuits.

Figure 5:
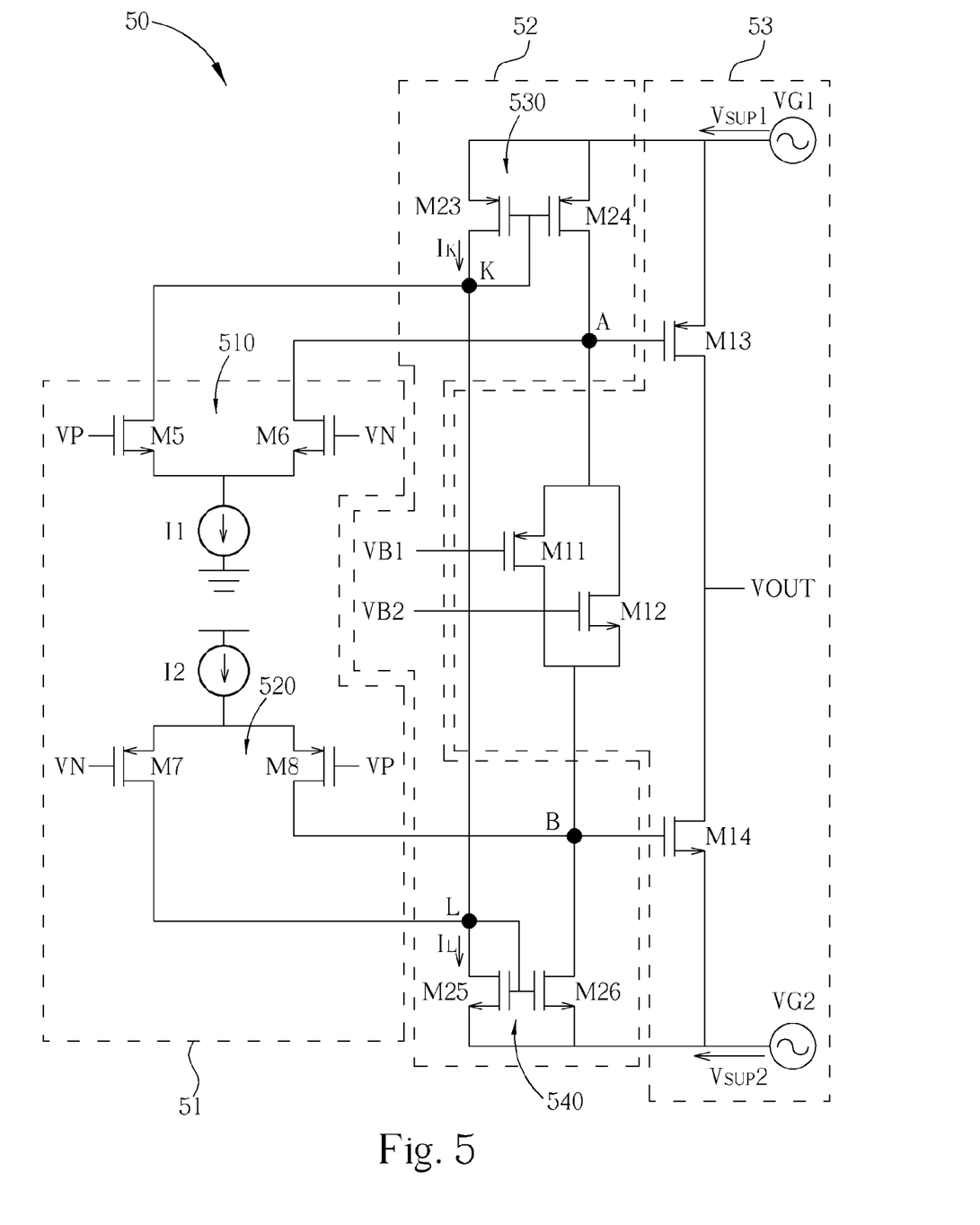
FIG. 5 is a schematic diagram of an operational amplifier with a rail-to-rail common-mode input and output range according to a third embodiment of the present invention.

Please refer to FIG. 5. FIG. 5 is a schematic diagram of an operational amplifier 50 with a rail-to-rail common-mode input and output range according to a third embodiment of the present invention. The operational amplifier 50 includes a differential input stage 51, a summing circuit 52 and a push-pull output stage 53, among which the differential input stage 51 and the push-pull output stage 53 are similar to the differential input stage 31 and the push-pull output stage 33 in FIG. 3, and thus are narrated again. The summing circuit 52 includes a first current mirror 530 and a second current mirror 540, and is utilized for summing up signals outputted by a first differential pair 510 and a second differential pair 520 of the differential input stage 51. The first current mirror 530, comprised by PMOS transistors M23 and M24, is formed in the upper part of the summing circuit 52, and is utilized for mapping a current IK flowing into a node K to the node A. The second current mirror 540, comprised by NMOS transistors M25 and M26, is formed in the lower part of the summing circuit 52, and is utilized for mapping a current IL flowing out of a node L to the node B.

Therefore, with the first current mirror 530 and the second current mirror 540, the operational amplifier 50 can sum up the currents outputted by the first differential pair 510 and the second differential pair 520, and can then output to the source coupled circuit 560 for generating the control voltage VAB to control the operation of the push-pull output stage 53. Besides, the operational amplifier 50 can also save the use of the floating current source, and can keep the quiescent currents of the output stage by the first current mirror 530 and the second current mirror 540, so that the number of the transistors can be reduced. In this case, the operating voltage of the operational amplifier 50 can be as low as 3V, and thus power saving demands for mobile devices can be satisfied.

As mentioned above, the operational amplifier of the present invention not only has a rail-to-rail common-mode input and output range, but also has a class AB output stage with better working efficiency and less distortion. Much more important is that the present invention keeps the least currents. Furthermore, compared with the prior art, the rail-to-rail operational amplifier of the present invention saves the use of the floating current source, and thus the number of the transistors can be reduced significantly, so as to further reduce the layout area and simplify the difficulty for integrating circuits.

Those skilled in the art will readily observe that numerous modifications and alterations of the device and method may be made while retaining the teachings of the invention.

What is claimed is:

1. An operational amplifier with a rail-to-rail common-mode input and output range comprising:
   a first voltage generator for generating a first supply voltage;
   a second voltage generator for generating a second supply voltage;
   a differential input stage, for receiving an input signal, comprising:
      a first differential pair comprising a first positive input terminal, a first negative input terminal, a first positive output terminal, and a first negative output terminal; and
      a second differential pair comprising a second positive input terminal, a second negative input terminal, a second positive output terminal, and a second negative output terminal;
   a summing circuit, coupled to the differential input stage and comprising a first current output terminal and a second current output terminal, for outputting a summation result of output signals of the first positive output terminal, the first negative output terminal, the second positive output terminal, and the second negative output terminal; and a push-pull output stage, coupled to the summing circuit, for outputting an amplification signal, comprising:
an output terminal for outputting the amplification signal;
a source coupled circuit, comprising a first terminal coupled to the first current output terminal of the summing circuit and a second terminal coupled to the second current output terminal of the summing circuit, for generating a control voltage according to currents of the first current output terminal and the second current output terminal;
a first output transistor comprising a source electrode coupled to the first voltage generator, a drain electrode coupled to the output terminal, and a gate electrode, coupled to the first terminal of the source coupled circuit, for controlling the first output transistor according to the control voltage of the source coupled circuit; and
a second output transistor comprising a source electrode coupled to the second voltage generator, a drain electrode coupled to the output terminal, and a gate electrode, coupled to the second terminal of the source coupled circuit, for controlling the second output transistor according to the control voltage of the source coupled circuit.

2. The operational amplifier of claim 1, wherein the first differential pair further comprises a pair of matched N type metal-oxide-semiconductor (NMOS) transistors.

3. The operational amplifier of claim 2, wherein the first differential pair further comprises:
a first NMOS transistor comprising a source electrode coupled to a first current source, a drain electrode coupled to the first positive output terminal of the first differential pair, and a gate electrode coupled to the first positive input terminal of the first differential pair; and
a second NMOS transistor comprising a source electrode coupled to the first current source, a drain electrode coupled to the first negative output terminal of the first differential pair, and a gate electrode coupled to the first negative input terminal of the first differential pair.

4. The operational amplifier of claim 1, wherein the second differential pair further comprises a pair of matched P type metal-oxide-semiconductor (PMOS) transistors.

5. The operational amplifier of claim 4, wherein the second differential pair further comprises:
a first PMOS transistor comprising a source electrode coupled to a second current source, a drain electrode coupled to the second negative output terminal of the second differential pair, and a gate electrode coupled to the second negative input terminal of the second differential pair; and
a second PMOS transistor comprising a source electrode coupled to the second current source, a drain electrode coupled to the second positive output terminal of the second differential pair, and a gate electrode coupled to the second positive input terminal of the second differential pair.

6. The operational amplifier of claim 1, wherein the summing circuit further comprises:
a first current mirror circuit comprising an input terminal coupled to the first positive output terminal of the first differential pair, and an output terminal;
a second current mirror circuit comprising an input terminal coupled to the first negative output terminal of the first differential pair, and an output terminal coupled to the first current output terminal; and
a third current mirror circuit comprising an input terminal coupled to the output terminal of the first current mirror circuit and the second negative output terminal of the second differential pair, and an terminal coupled to the second current output terminal.

7. The operational amplifier of claim 6, wherein the first current mirror circuit further comprises:
a first PMOS transistor comprising a source electrode coupled to the first voltage generator, a drain electrode coupled to the input terminal of the first current mirror circuit, and a gate electrode coupled to the input terminal of the first current mirror circuit; and
a second PMOS transistor comprising a source electrode coupled to the first voltage generator, a drain electrode coupled to the output terminal of the first current mirror circuit, and a gate electrode coupled to the gate electrode and the drain electrode of the first PMOS transistor.

8. The operational amplifier of claim 6, wherein the second current mirror circuit further comprises:
a first PMOS transistor comprising a source electrode coupled to the first voltage generator, a drain electrode coupled to the input terminal of the second current mirror circuit, and a gate electrode coupled to the input terminal of the second current mirror circuit; and
a second PMOS transistor comprising a source electrode coupled to the first voltage generator, a drain electrode coupled to the output terminal of the second current mirror circuit, and a gate electrode coupled to the gate electrode and the drain electrode of the first PMOS transistor.

9. The operational amplifier of claim 6, wherein the third current mirror circuit further comprises:
a first NMOS transistor comprising a source electrode coupled to the second voltage generator, a drain electrode coupled to the input terminal of the third current mirror circuit, and a gate electrode coupled to the input terminal of the third current mirror circuit; and
a second NMOS transistor comprising a source electrode coupled to the second voltage generator, a drain electrode coupled to the output terminal of the third current mirror circuit, and a gate electrode coupled to the gate electrode and the drain electrode of the first NMOS transistor.

10. The operational amplifier of claim 1, wherein the summing circuit further comprises:
a cascade current source circuit comprising a first input terminal coupled to the first positive output terminal of the first differential pair, a second input terminal coupled to the first negative output terminal of the first differential pair, a first output terminal, and a second output terminal coupled to the first current output terminal; and
a current mirror circuit comprising a first input terminal coupled to the second negative output terminal of the second differential pair, a second input terminal coupled to the second positive output terminal of the second differential pair, a third input terminal coupled to the first output terminal of the cascade current source circuit, and a first output terminal coupled to the second current output terminal.

11. The operational amplifier of claim 10, wherein the cascade current source circuit further comprises:
a first PMOS transistor comprising a source electrode coupled to the first voltage generator, a drain electrode coupled to the first input terminal of the cascade current source circuit, and a gate electrode coupled to a first bias voltage;

a second PMOS transistor comprising a source electrode coupled to the first voltage generator, a drain electrode coupled to the second input terminal of the cascade current source circuit, and a gate electrode coupled to the first bias voltage;

a third PMOS transistor comprising a source electrode coupled to the first input terminal of the cascade current source circuit, a drain electrode coupled to the first output terminal of the cascade current source circuit, and a gate electrode coupled to a second bias voltage; and a forth PMOS transistor comprising a source electrode coupled to the second input terminal of the cascade current source circuit, a drain electrode coupled to the second output terminal of the cascade current source circuit, and a gate electrode coupled to the second bias voltage.

12. The operational amplifier of claim 10, wherein the current mirror circuit further comprises:

a first NMOS transistor comprising a source electrode coupled to the first input terminal of the current mirror circuit, a drain electrode coupled to the third input terminal of the current mirror circuit, and a gate electrode coupled to a third bias voltage;

a second NMOS transistor comprising a source electrode coupled to the second input terminal of the current mirror circuit, a drain electrode coupled to the first output terminal of the current mirror circuit, and a gate electrode coupled to the third bias voltage;

a third NMOS transistor comprising a source electrode coupled to the second voltage generator, a drain electrode coupled to the first input terminal of the current mirror circuit, and a gate electrode coupled to the third input terminal of the current mirror circuit; and a forth NMOS transistor comprising a source electrode coupled to the second voltage generator, a drain electrode coupled to the second input terminal of the current mirror circuit, and a gate electrode coupled to the third input terminal of the current mirror circuit.

13. The operational amplifier of claim 1, wherein the summing circuit further comprises:

a first current mirror circuit comprising an input terminal coupled to the first positive output terminal of the first differential pair, and an output terminal coupled to the first negative output terminal of the first differential pair and the first current output terminal; and a second current mirror circuit comprising an input terminal coupled to the first negative output terminal of the second differential pair, and an output terminal coupled to the first positive output terminal of the second differential pair and the second current output terminal.

14. The operational amplifier of claim 13, wherein the first current mirror circuit further comprises:

a first PMOS transistor comprising a source electrode coupled to the first voltage generator, a drain electrode coupled to the input terminal of the first current mirror circuit, and a gate electrode coupled to the input terminal of the first current mirror circuit; and a second PMOS transistor comprising a source electrode coupled to the first voltage generator, a drain electrode coupled to the output terminal of the first current mirror circuit, and a gate electrode coupled to the gate electrode and the drain electrode of the first PMOS transistor.

15. The operational amplifier of claim 13, wherein the second current mirror circuit further comprises:

a first NMOS transistor comprising a source electrode coupled to the second voltage generator, a drain electrode coupled to the input terminal of the second current mirror circuit, and a gate electrode coupled to the input terminal of the second current mirror circuit; and a second NMOS transistor comprising a source electrode coupled to the second voltage generator, a drain electrode coupled to the output terminal of the second current mirror circuit, and a gate electrode coupled to the gate electrode and the drain electrode of the first NMOS transistor.

16. The operational amplifier of claim 1, wherein the source coupled circuit further comprises a pair of parallel complementary metal-oxide-semiconductor (CMOS) transistors.

17. The operational amplifier of claim 13, wherein the source coupled circuit further comprises:

a PMOS transistor comprising a source electrode coupled to the first terminal of the source coupled circuit, a drain electrode coupled to the second terminal of the source coupled circuit, and a gate electrode coupled to a first bias voltage; and an NMOS transistor comprising a source electrode coupled to the second terminal of the source coupled circuit, a drain electrode coupled to the first terminal of the source coupled circuit, and a gate electrode coupled to a second bias voltage.

18. The operational amplifier of claim 1, wherein the first output transistor is a P type metal-oxide-semiconductor (PMOS) transistor.

19. The operational amplifier of claim 1, wherein the second output transistor is an N type metal-oxide-semiconductor (NMOS) transistor.

* * * * *